United States Patent
Lai et al.

(10) Patent No.: US 9,692,314 B2
(45) Date of Patent: Jun. 27, 2017

(54) DETECTION CIRCUIT AND THREE-PHASE AC-TO-AC POWER CONVERTING APPARATUS INCORPORATING THE SAME

(71) Applicant: LITE-ON TECHNOLOGY CORP., Taipei 11492 (TW)

(72) Inventors: Yen-Shin Lai, Taipei 11492 (TW); Pane-You Liu, Taipei 11492 (TW)

(73) Assignees: Lite-On Electronics (Guangzhou) Limited, Guangzhou (CN); Lite-on Technology Corp., Taipei (TW)

( * ) Notice: Subject to any disclaimer, the term of this patent is extended or adjusted under 35 U.S.C. 154(b) by 0 days.

(21) Appl. No.: 15/072,504

(22) Filed: Mar. 17, 2016

(65) Prior Publication Data

US 2016/0285381 A1 Sep. 29, 2016

(30) Foreign Application Priority Data

Mar. 24, 2015 (CN) ..................... 2015 2 0166518 U (51) Int. Cl.
*H02M 5/458* (2006.01)
*G01R 31/42* (2006.01)
*H02M 1/32* (2007.01)
*H02J 3/36* (2006.01)
*H02M 7/06* (2006.01)

(52) U.S. Cl.
CPC ............ *H02M 5/458* (2013.01); *G01R 31/42* (2013.01); *H02M 1/32* (2013.01); *H02M 7/062* (2013.01)

(58) Field of Classification Search
CPC .......... H02J 3/36; H02M 7/7575; H02M 5/40; H02M 5/42; H02M 5/453; H02M 5/458; H02M 2001/0009
See application file for complete search history.

(56) References Cited

U.S. PATENT DOCUMENTS

| | | | | |
|---|---|---|---|---|
| 4,158,163 A | * | 6/1979 | Eriksen | H02P 27/06 318/798 |
| 4,188,663 A | * | 2/1980 | Okawa | H02H 3/24 363/37 |
| 4,620,272 A | * | 10/1986 | Fulton | H02P 23/06 318/762 |
| 4,841,426 A | * | 6/1989 | Hakala | H02M 5/4585 318/801 |
| 2006/0133120 A1 | * | 6/2006 | Sato | H02M 5/4585 363/37 |
| 2013/0027992 A1 | * | 1/2013 | Bucker | H02J 3/26 363/34 |

* cited by examiner

*Primary Examiner* — Gary L Laxton
(74) *Attorney, Agent, or Firm* — Rosenberg, Klein & Lee (57) ABSTRACT

A detection circuit for an AC-to-AC power converter includes a voltage divider circuit that has three AC input terminal coupled respectively to three input ends of a power converter which are to receive respectively three AC input power signals with different phases, and that receives a predetermined first reference voltage. Upon receiving one AC input power signal, the voltage divider circuit outputs a divided voltage, which during an active period of the one AC input power signal, is greater than a predetermined second reference voltage, to a comparator, which also receives the predetermined second reference voltage, such that the comparator outputs a detection signal that is in an active state when the one AC input power signal is.

20 Claims, 11 Drawing Sheets

DETECTION CIRCUIT AND THREE-PHASE AC-TO-AC POWER CONVERTING APPARATUS INCORPORATING THE SAME

CROSS-REFERENCE TO RELATED APPLICATION

This application claims priority to Chinese Application No. 201520166518.2, filed on Mar. 24, 2015, the contents of which are hereby incorporated by reference.

FIELD

The disclosure relates to an AC-to-AC converter, and more particularly to a detection circuit capable of automatically detecting a misconnection, and a three-phase AC-to-AC power converting apparatus incorporating the same.

BACKGROUND

Figure 1:
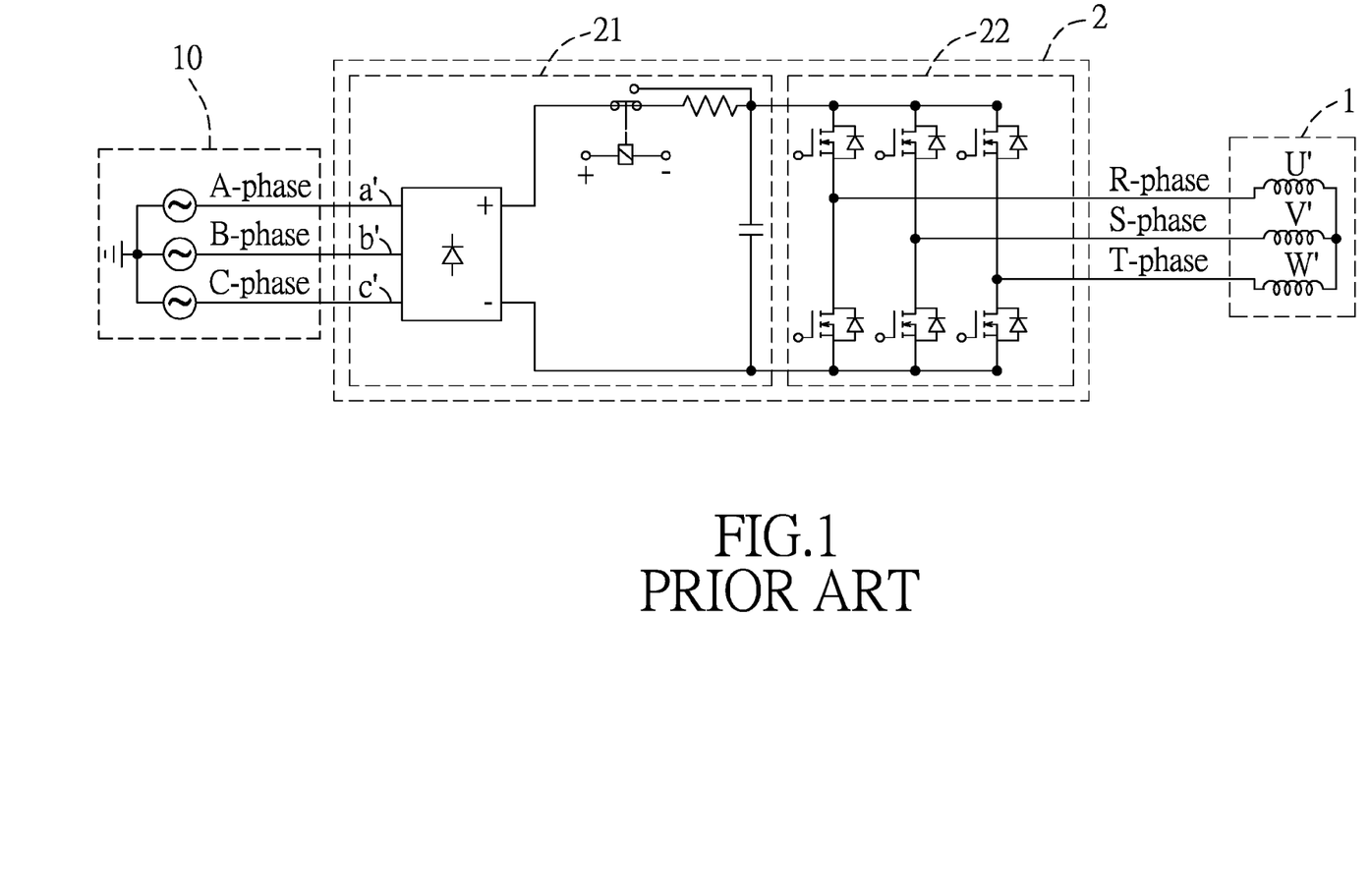
FIG. 1 is a schematic electrical circuit diagram illustrating a conventional three-phase AC-to-AC power converter connected electrically between a three-phase commercial power source and a three-phase motor.

Referring to FIG. 1, a conventional three-phase AC-to-AC power converter 2 is used to drive a three-phase motor 1. The conventional three-phase AC-to-AC power converter 2 includes a rectifying and filtering circuit 21 and an electronic inverter 22. The rectifying and filtering circuit 21 has three input ends (a', b', c') for receiving respectively A-, B- and C-phase AC input power signals from a three-phase commercial power source 10, and rectifies and filters the A-, B- and C-phase AC input power signals to generate a DC voltage signal. The electronic inverter 22 is coupled to the rectifying and filtering circuit 21 for receiving the DC voltage signal therefrom, and is controlled by a controller (not shown in FIG. 1) to generate, based on the DC voltage signal, an R-phase AC output power signal, an S-phase AC output power signal and a T-phase AC output power signal that are supplied respectively to three windings (U', V', W') of the three-phase motor 1 so as to drive the three-phase motor 1.

Figure 2:
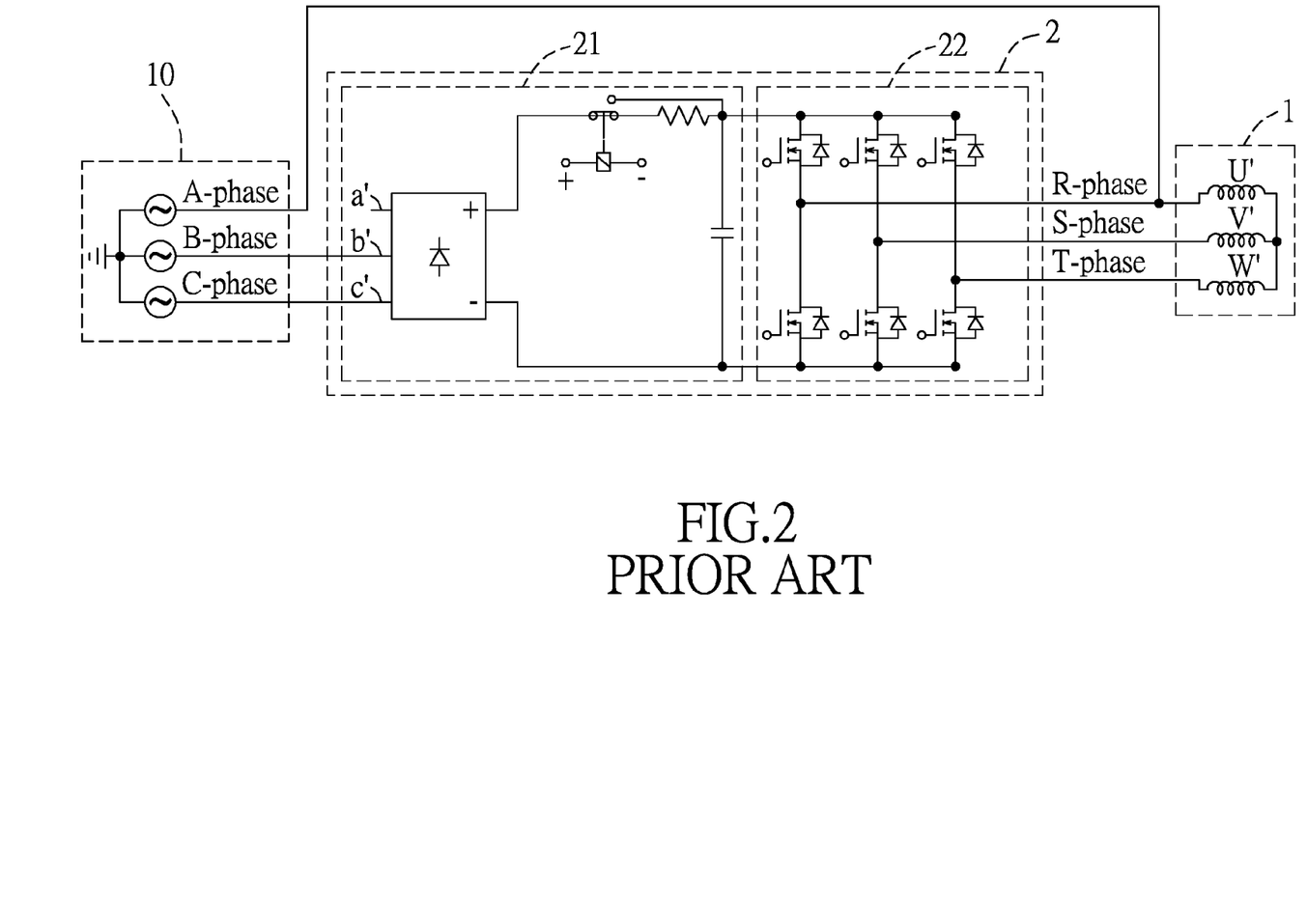
FIG. 2 is a schematic electrical circuit diagram illustrating an exemplary fault wiring condition of the conventional three-phase AC-to-AC power converter.

However, when a misconnection occurs during wire connection, for example, an A-phase terminal of the three-phase commercial power source 10 for outputting the A-phase AC input power signal is unintentionally connected electrically to an R-phase output terminal of the electronic inverter 22, as shown in FIG. 2, one power switch of the electronic inverter 22 may be burned out due to an instantaneous large current directly from the three-phase commercial power source 10, thereby causing malfunctions of or damage to the conventional three-phase AC-to-AC power converter 2.

SUMMARY

Therefore, an object of the disclosure is to provide a detection circuit capable of automatically detecting wiring errors, and a three-phase AC-to-AC power converting apparatus incorporating the same.

According to one aspect of the disclosure, there is provided a detection circuit for a three-phase AC-to-AC power converter. The three-phase AC-to-AC power converter has three input ends that are configured to receive respectively a first-phase AC input power signal, a second-phase AC input power signal and a third-phase AC input power signal from a three-phase AC power source. The detection circuit of this disclosure includes a voltage divider circuit and a comparator.

The voltage divider circuit is for generating a divided voltage, and has three AC input terminals that are used to be coupled respectively to the input ends of the three-phase AC-to-AC power converter, a DC input terminal that is used to receive a predetermined first reference voltage from a DC voltage source, and a circuit output terminal at which the divided voltage is generated.

The comparator is for generating a detection signal, and has a non-inverting input terminal that is coupled to the circuit output terminal of the voltage divider circuit, an inverting input terminal that is used to receive a predetermined second reference voltage, and a comparator output terminal at which the detection signal is generated.

When at least one of the first-, second- and third-phase AC input power signals from the three-phase AC power source is received at respective one (s) of said AC input terminals of said voltage divider circuit, the voltage divider circuit generates the divided voltage at the circuit output terminal thereof based on the predetermined first reference voltage from the DC voltage source and the at least one of the first-, second- and third-phase AC input power signals. The divided voltage is greater than the predetermined second reference voltage during an active period of each of the at least one of the first-, second- and third-phase AC input power signals, such that the detection signal outputted by the comparator has a duty cycle associated with a combined duty cycle of the at least one of the first-, second- and third-phase AC input power signals.

According to another aspect of the disclosure, a three-phase AC-to-AC power converting apparatus includes a three-phase AC-to-AC power converter and a detection circuit.

The three-phase AC-to-AC power converter has three input ends that are configured to receive respectively a first-phase AC input power signal, a second-phase AC input power signal and a third-phase AC input power signal from a three-phase AC power source, and three output ends. The three-phase AC-to-AC power converter is operable, in response to receipt of the first-, second- and third-phase AC input power signals, to convert the first-phase, second-phase and third-phase AC input power signals into a first-phase AC output power signal, a second-phase AC output power signal and a third-phase AC output power signal, and to output the first-, second- and third-phase AC output power signals respectively at the output ends.

The detection circuit includes a voltage divider circuit and a comparator. The voltage divider circuit is for generating a divided voltage, and has three AC input terminals that are coupled respectively to the input ends of the AC-to-AC power converter, a DC input terminal that is used to receive a predetermined first reference voltage from a DC voltage source, and a circuit output terminal at which the divided voltage is generated. The comparator is for generating a detection signal, and has a non-inverting input terminal that is coupled to the circuit output terminal of the voltage divider circuit, an inverting input terminal that is used to receive a predetermined second reference voltage, and a comparator output terminal at which the detection signal is generated.

When at least one of the first-, second- and third-phase AC input power signals from the three-phase AC power source is received at respective one (s) of said AC input terminals of said voltage divider circuit, the voltage divider circuit generates the divided voltage at the circuit output terminal thereof based on the predetermined first reference voltage and the at least one of the first-, second- and third-phase AC input power signals. The divided voltage is greater than the predetermined second reference voltage during an active period of each of the at least one of the first-, second- and third-phase AC input power signals, such that the detection signal outputted by the comparator has a duty cycle associated with a combined duty cycle of the at least one of the first-, second- and third-phase AC input power signals.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before describing the disclosure in greater detail, it should be noted herein that like elements are denoted by the same reference numerals throughout this disclosure. In addition, when two elements are described as being "coupled in series," "connected in series" or the like, it is merely intended to portray a serial connection between the two elements without necessarily implying that the currents flowing through the two elements are identical to each other and without limiting whether or not an additional element is coupled to a common node between the two elements. Essentially, "a series connection of elements," "a series coupling of elements" or the like as used throughout this disclosure should be interpreted as being such when looking at those elements alone.

Figure 3:
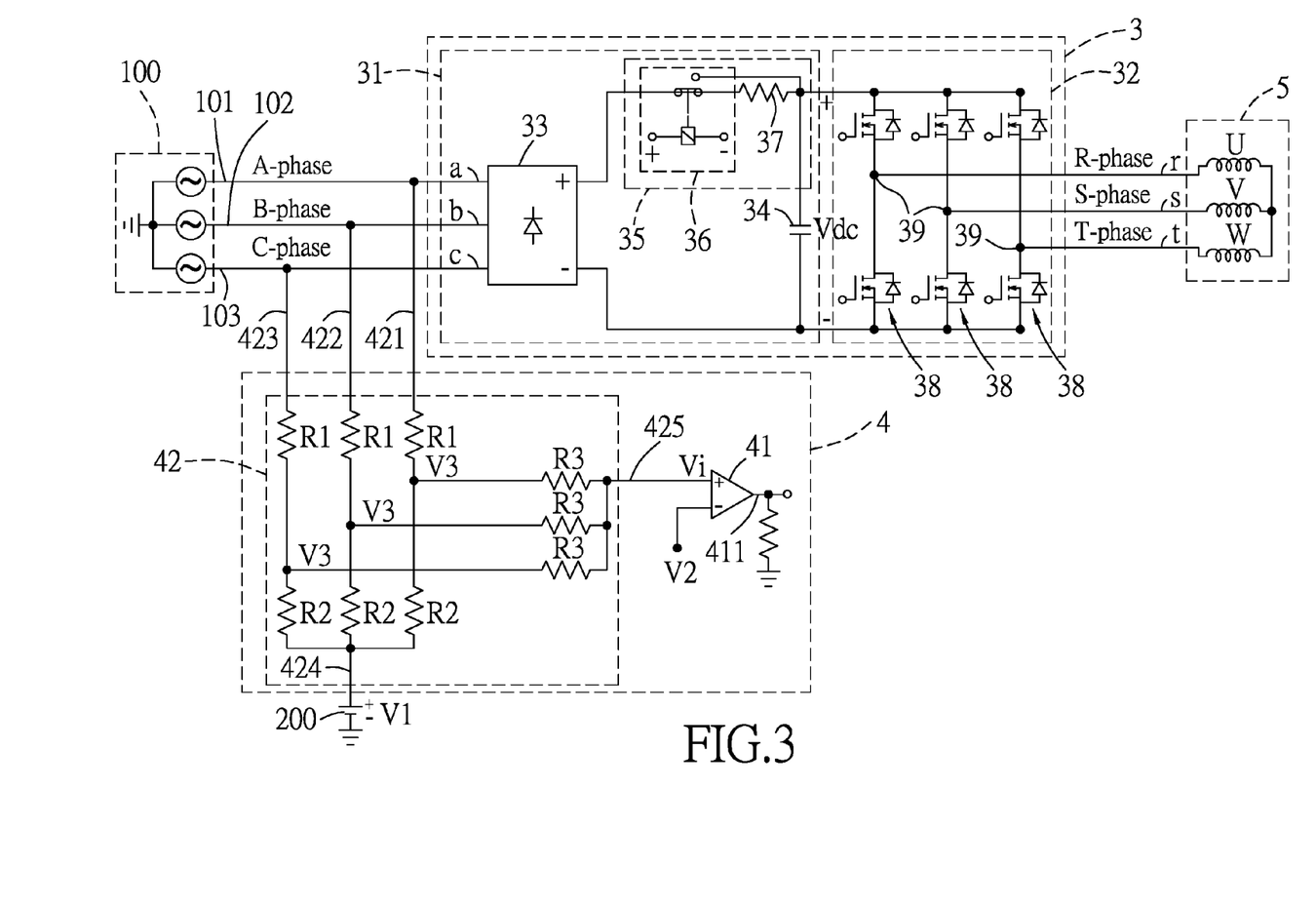
FIG. 3 is a schematic electrical circuit diagram illustrating the embodiment of a three-phase AC-to-AC power converting apparatus according to the disclosure.

Referring to FIG. 3, the embodiment of a three-phase AC-to-AC power converting apparatus according to this disclosure is shown to be used with a three-phase AC power source 100 and a three-phase motor 5. In this embodiment, the three-phase AC power source 100 is, but not limited to, a three-phase commercial power source, and has, for example, an A-phase terminal 101, a B-phase terminal 102 and a C-phase terminal 103 for outputting respectively an A-phase AC input power signal, a B-phase AC input power signal and a C-phase AC input power signal that serve as first-, second- and third-phase input power signals, respectively. The three-phase motor 5 includes three windings (U, V, W). The three-phase AC-to-AC power converting apparatus includes a three-phase AC-to-AC power converter 3 and a detection circuit 4.

The three-phase AC-to-AC power converter 3 has three input ends (a, b, c) that are to be coupled respectively to the A-, B- and C-phase terminals 101, 102, 103 of the three-phase AC power source 100 for receiving the A-, B- and C-phase AC input power signals therefrom, and three output ends (r, s, t) that are used to be coupled respectively to the windings (U, V, W) of the three-phase motor 5. When the three-phase AC-to-AC power converter 3 receives the A-, B- and C-phase input power signals from the three-phase AC power source 100, the three-phase AC-to-AC power converter 3 converts the A-, B- and C-phase input power signals into an R-phase AC output power signal, an S-phase AC output power signal and a T-phase AC output power signal that serve as first-, second- and third-phase AC output power signals, respectively, and that are outputted respectively at the output ends (r, s, t). Accordingly, the R-, S- and T-phase AC output power signals from the output ends (r, s, t) are supplied respectively to the three windings (U, V, W) of the three-phase motor 5 so as to drive the three-phase motor 5. In this embodiment, the three-phase AC-to-AC power converter 3 includes a rectifying and filtering circuit 31 and an electronic inverter 32.

The rectifying and filtering circuit 31 includes a rectifier 33, a filter capacitor 34, and a current limiting circuit 35 coupled to the rectifier 33 and the filter capacitor 34. The rectifier 33 has the input ends (a, b, c), and is used to rectify the A-, B- and C-phase AC input power signals into a DC signal. The current limiting circuit 35 includes a relay switch 36, and a current limiting resistor 37 coupled between the relay switch 36 and the filter capacitor 34, and is used to limit a current flowing into the filter capacitor 34. The filter capacitor 34 filters the DC signal passing through the current limiting circuit 35 to output a DC voltage signal (Vdc).

The electronic inverter 32 is coupled across the filter capacitor 34 of the rectifying and filtering circuit 31 for receiving the DC voltage signal (Vdc) therefrom, and has the output ends (r, s, t). The electronic inverter 32 includes three switch units 38, each of which has two switches coupled in series to each other. A common node 39 between the two switches of each of the switch units 38 is coupled to a respective one of the output ends (r, s, t). The switches of the electronic inverter 32 are controlled by a controller (not shown in FIG. 3) to generate, based on the DC voltage signal (Vdc), the R-, S- and T-phase AC output power signals that are outputted respectively at the output ends (r, t, s).

The detection circuit 4 includes a voltage divider circuit 42 and a comparator 41.

The voltage divider circuit 42 generates a divided voltage (Vi), and has three AC input terminals 421, 422, 423 that are coupled respectively to the input ends (a, b, c) of the three-phase AC-to-AC power converter 3, a DC input terminal 424 that is used to receive a predetermined first reference voltage (V1) from a DC voltage source 200, and a circuit output terminal 425 at which the divided voltage (Vi) is generated. In this embodiment, the voltage divider circuit 42 includes three resistor units, each of which includes a first resistor (R1) that is coupled to a respective one of the AC input terminals 421, 422, 423, a second resistor (R2) that is coupled between the first resistor (R1) and the DC input terminal 424 and that has a resistance less than that of the first resistor (R1), and a third resistor (R3) that is coupled between the circuit output terminal 425 and a common node between the first and second resistors (R1, R2). It is noted that the third resistor (R3) of each resistor unit is used for impedance matching. In this embodiment, a resistance value of the first resistor (R1) is greater than a resistance value of the second resistor (R2), and the resistance value of the second resistor (R2) is greater than a resistance value of the third resistor (R3). However, in some embodiments, the third resistor (R3) of each resistor unit may be omitted. In other words, the common node between the first and second resistors (R1, R2) of each resistor unit may be coupled directly to the circuit output terminal 425.

The comparator 41 is for generating a detection signal, and has a non-inverting (positive) input terminal coupled to the circuit output terminal 425 of the voltage divider circuit 42, an inverting (negative) input terminal used to receive a predetermined second reference voltage (V2) from a voltage source (not shown), and a comparator output terminal 411 at which the detection signal is generated. It is noted that the second reference voltage (V2) is greater than the predetermined first reference voltage (V1).

When at least one of the A-, B- and C-phase AC input power signals from the three-phase AC power source 100 is received at the respective one(s) of the AC input terminals 421, 422, 423 of the voltage divider circuit 42, the voltage divider circuit 42 generates the divided voltage (Vi) at the circuit output terminal 425 based on the predetermined first reference voltage (V1) and the one of the A-, B- and C-phase AC input power signals. The divided voltage (Vi) is greater than the predetermined second reference voltage (V2) during an active period of each of the at least one of the A-, B- and C-phase AC input power signals, during which the corresponding one of the at least one of the A-, B- and C-phase AC input power signals is in an active state (e.g., high) (as opposed to an inactive state (e.g., low)). As such, the detection signal outputted by the comparator 41 is in an active state when whichever one of the A-, B- and C-phase AC input power signals received by the voltage divider circuit 42 is in the active state. Therefore, the detection signal would have a duty cycle associated with a combined duty cycle of the at least one of the A-, B- and C-phase AC input power signals (i.e., the one(s) received by the voltage divider circuit 42). In other words, the detection signal has a relatively high voltage level during the active period of the one of the A-, B- and C-phase AC input power signals.

In detail, when one of the A-, B- and C-phase AC input power signals received at the respective one of the AC input terminals 421, 422, 423 of the voltage divider circuit 42 is in the active state, the divided voltage (Vi) is equal to a sum of the predetermined first reference voltage (V1) and a voltage drop (V3) across the second resistor (R2) of the respective resistor unit (i.e., Vi=V1+V3). When one of the A-, B- and C-phase AC input power signals, which should otherwise be received by the one of the AC input terminals 421, 422, 423 should the three-phase AC-to-AC power converter 3 be correctly connected to the three-phase AC power source 100 as shown in FIG. 3, is not received at the respective one of the AC input terminals 421, 422, 423 of the voltage divider circuit 42, the divided voltage (Vi) is equal to the predetermined first reference voltage (V1) during a period that corresponds to the active period of the one of the A-, B- and C-phase AC input power signals.

Figure 4:
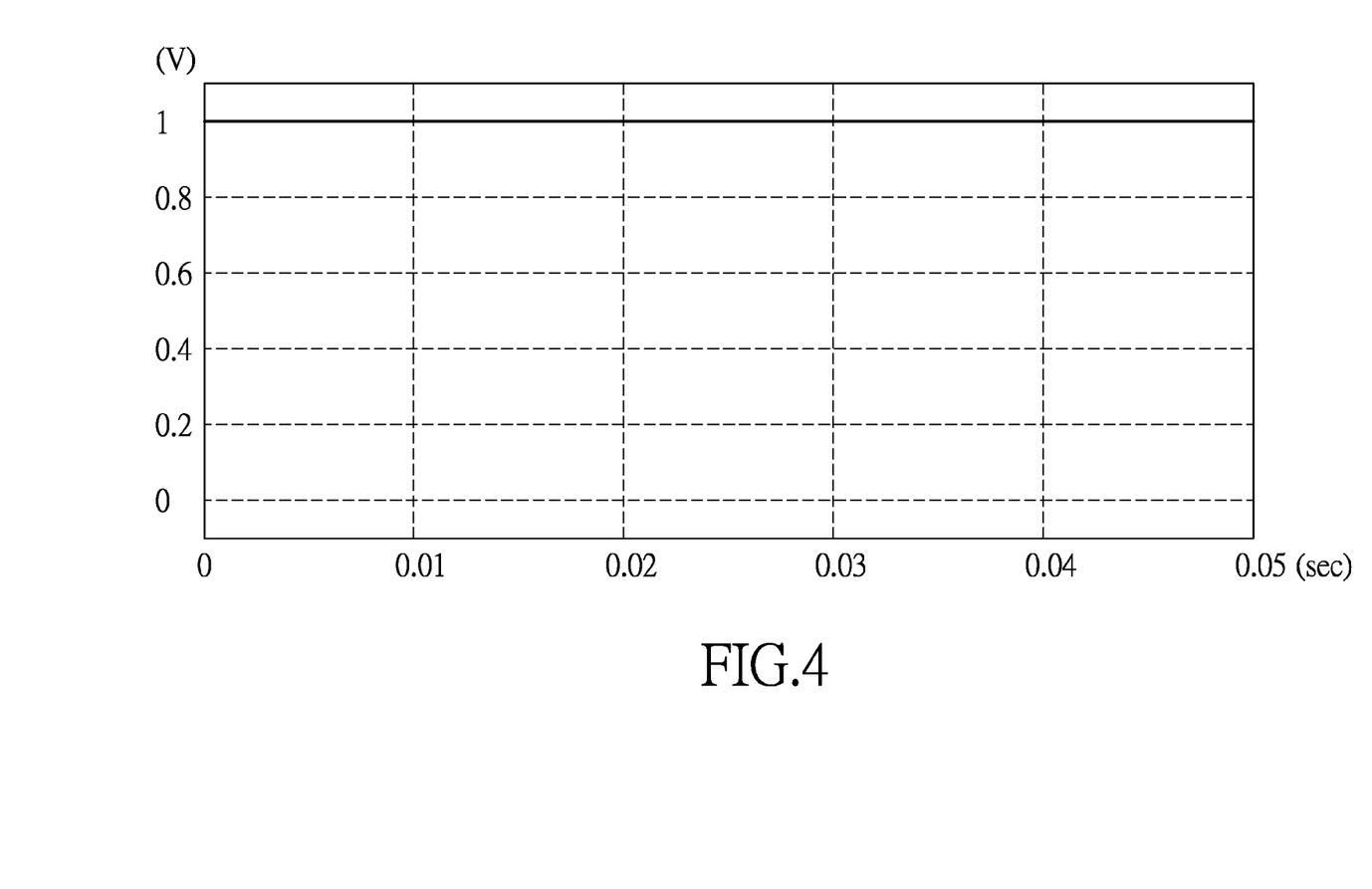
FIG. 4 is a plot exemplarily illustrating a detection signal generated by a detection circuit of the embodiment having a duty cycle of 1 with no misconnection between a three-phase AC-to-AC power converter of the embodiment and a three-phase AC power source.

Therefore, for example, the A-, B- and C-phase AC input power signals may be synchronized and each have a duty cycle of ⅓, wherein the active periods thereof are staggered by approximately 120 degrees (i.e., one third of a cycle period). In a normal condition, as shown in FIG. 3, where the A-, B- and C-phase terminals 101, 102, 103 of the three-phase AC power source 100 are correctly connected respectively to the input ends (a, b, c) of the three-phase AC-to-AC power converter 3, all the A-, B- and C-phase AC input power signals are received by the three-phase AC-to-AC power converter 3 without phase loss issue. At the same time, since all the A-, B- and C-phase AC input power signals are also received by the voltage divider circuit 42, the divided voltage (Vi) is maintained at the sum of the predetermined first reference voltage (V1) and the voltage drop (V3), and is greater than the predetermined second reference voltage (V2) during each cycle period, such that the detection signal outputted by the comparator 41 is maintained at the relatively high voltage level during each cycle period. In this case, in an example with R1=100 kΩ, R2=680Ω, R3=120Ω, V1=5V and V2=5.5V, the detection signal outputted by the comparator 41, as illustrated in FIG. 4, is maintained at the relatively high voltage level of 1V during each cycle period.

Figure 5:
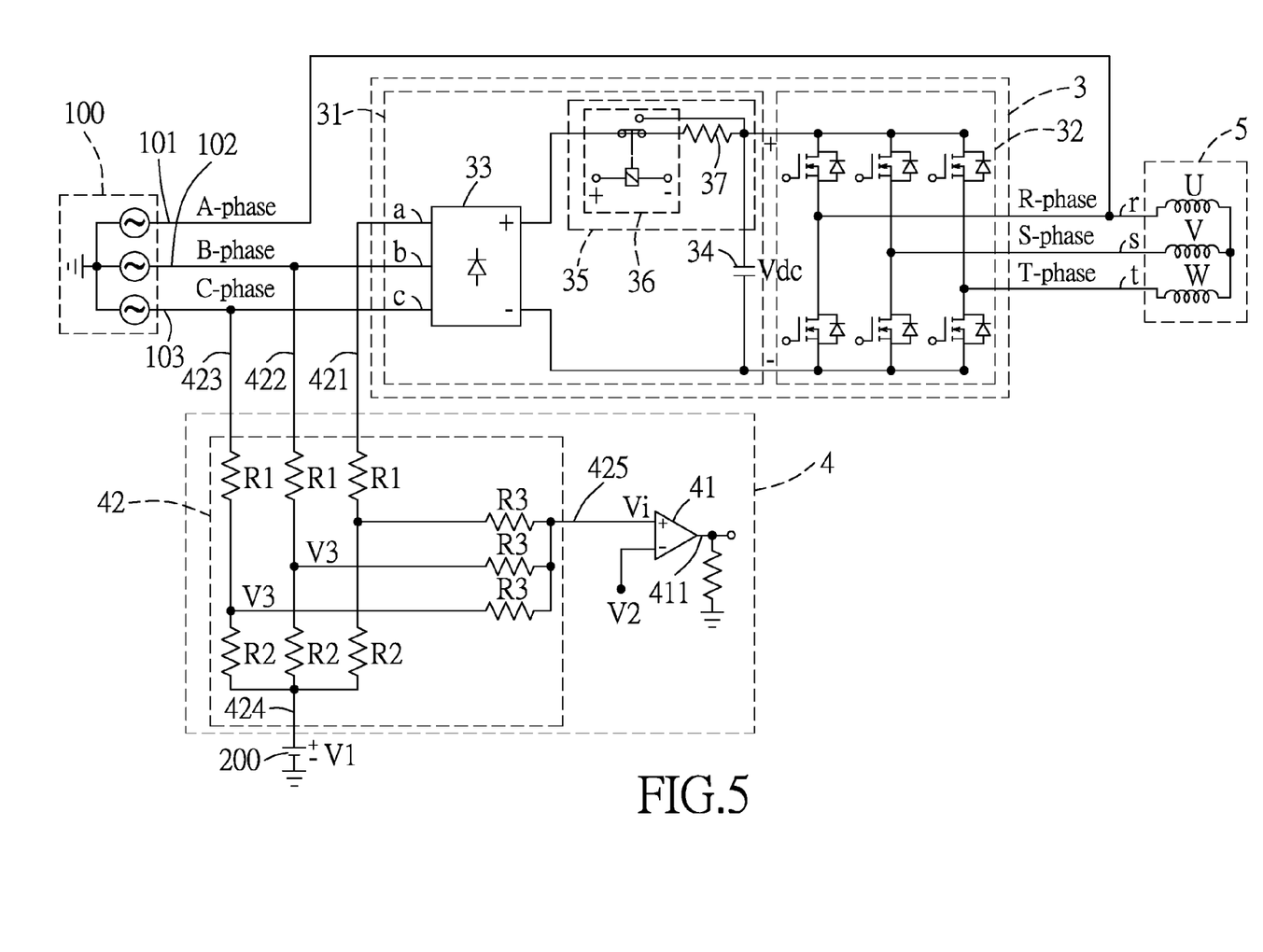
FIG. 5 is a schematic electrical circuit diagram illustrating the embodiment when a misconnection occurs between an A-phase terminal of the three-phase AC power source and the three-phase AC-to-AC power converter.
Figure 6:
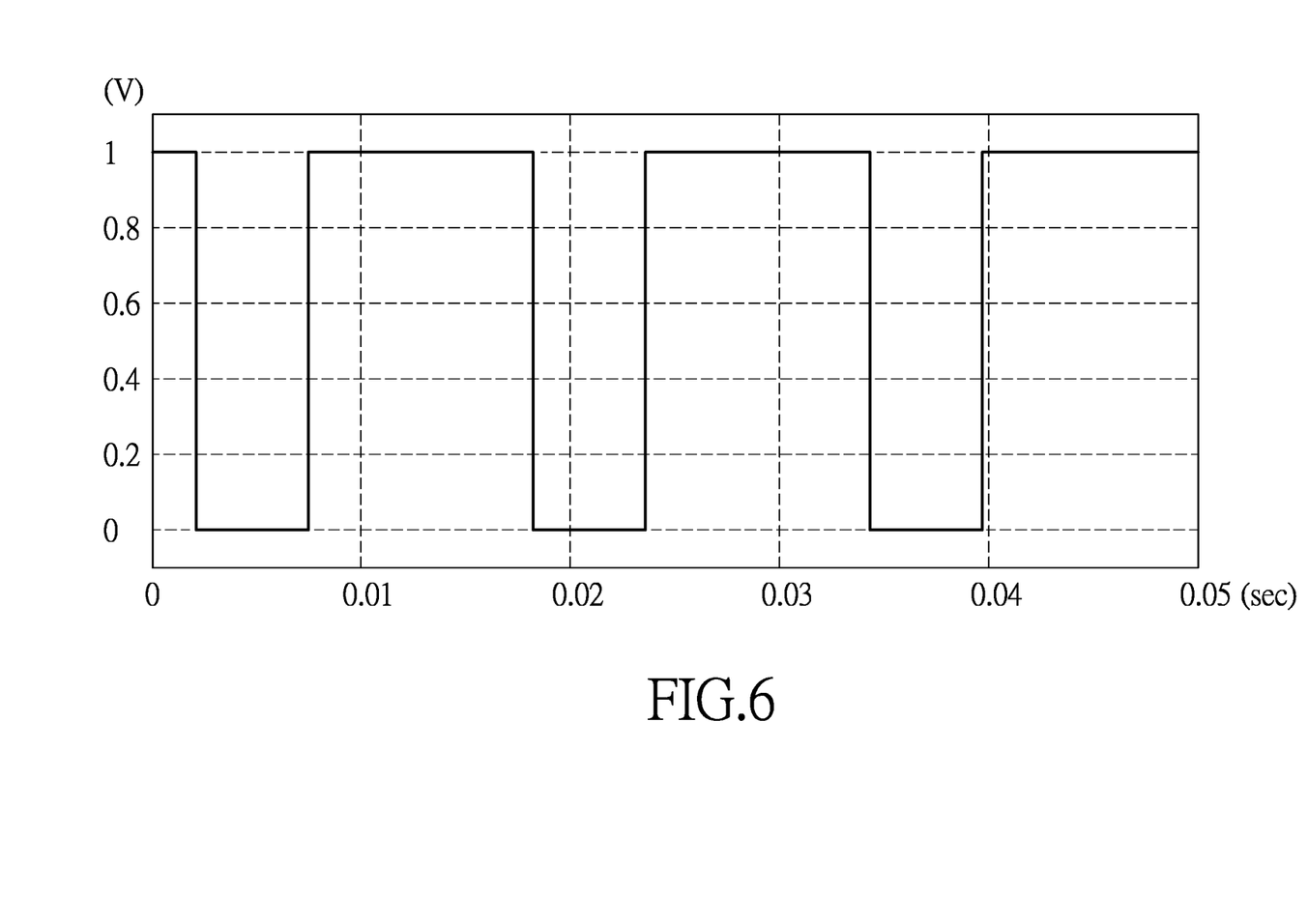
FIG. 6 is a plot exemplarily illustrating the detection signal of the embodiment having a duty cycle of ⅔ under the condition depicted in FIG. 5.

Referring further to FIGS. 5 and 6, for example, when the A-phase terminal 101 of the three-phase AC input power source 100 is unintentionally not connected to the input end (a) of the three-phase AC-to-AC power converter 3 and is misconnected to the output end (r) of the same (in an abnormal condition), only the B- and C-phase AC input power signals are received by the three-phase AC-to-AC power converter 3, such that a phase loss occurs in the three-phase AC-to-AC power converter 3. At the same time, since only the B- and C-phase AC input power signals are received by the detection circuit 4, in each cycle period, the divided voltage (Vi) is maintained at the sum of the predetermined first reference voltage (V1) and the voltage drop (V3), and is greater than the predetermined second reference voltage (V2) during the active period of each of the B- and C-phase AC input power signals, and is equal to the predetermined first reference voltage (V1) less than the predetermined second reference voltage (V2) when otherwise. In particular, since the A-phase AC input signal is not received, the voltage drop (V3) is equal to zero such that the divided voltage (Vi) received by the non-inverting (positive) input terminal of the comparator 41 is substantially equal to the predetermined first reference voltage (V1) less than the predetermined second reference voltage (V2). As a result, the detection signal outputted by the comparator 41 is maintained at a relatively low voltage level (e.g., 0V) during the active period of the A-phase AC input power signal of each cycle period. Accordingly, the detection signal outputted by the comparator 41 is maintained at the relatively high voltage level during the active periods respectively of the B- and C-phase AC input power signals and at the relatively low voltage level during the remainder of each cycle period. In this case, according to the above example, the detection signal outputted by the comparator 41, as illustrated in FIG. 6, has a duty cycle of ⅔ (i.e., the combined duty cycle of the B- and C-phase AC input power signals). Therefore, a misconnection between one of the A-, B- and C-phase terminals 101, 102, 103 of the three-phase AC power source 100 and the three-phase AC-to-AC power converter 3 is detectable, as well as a phase loss of the three-phase AC power source 100. Namely, occurrence of a pulse in the detection signal outputted by the comparator 41 indicates an abnormal power supply condition, and the duty cycle of the detection signal or a pulse width of the pulse can be employed to determine the wiring condition between the three-phase AC power source 100 and the three-phase AC-to-AC power converter 3. For example, as shown in FIG. 6, the detection signal having a duty cycle of ⅔ indicates that one of the A-, B- and C-phase terminals of the three-phase AC power source 100 is misconnected, resulting a phase loss.

Figure 7:
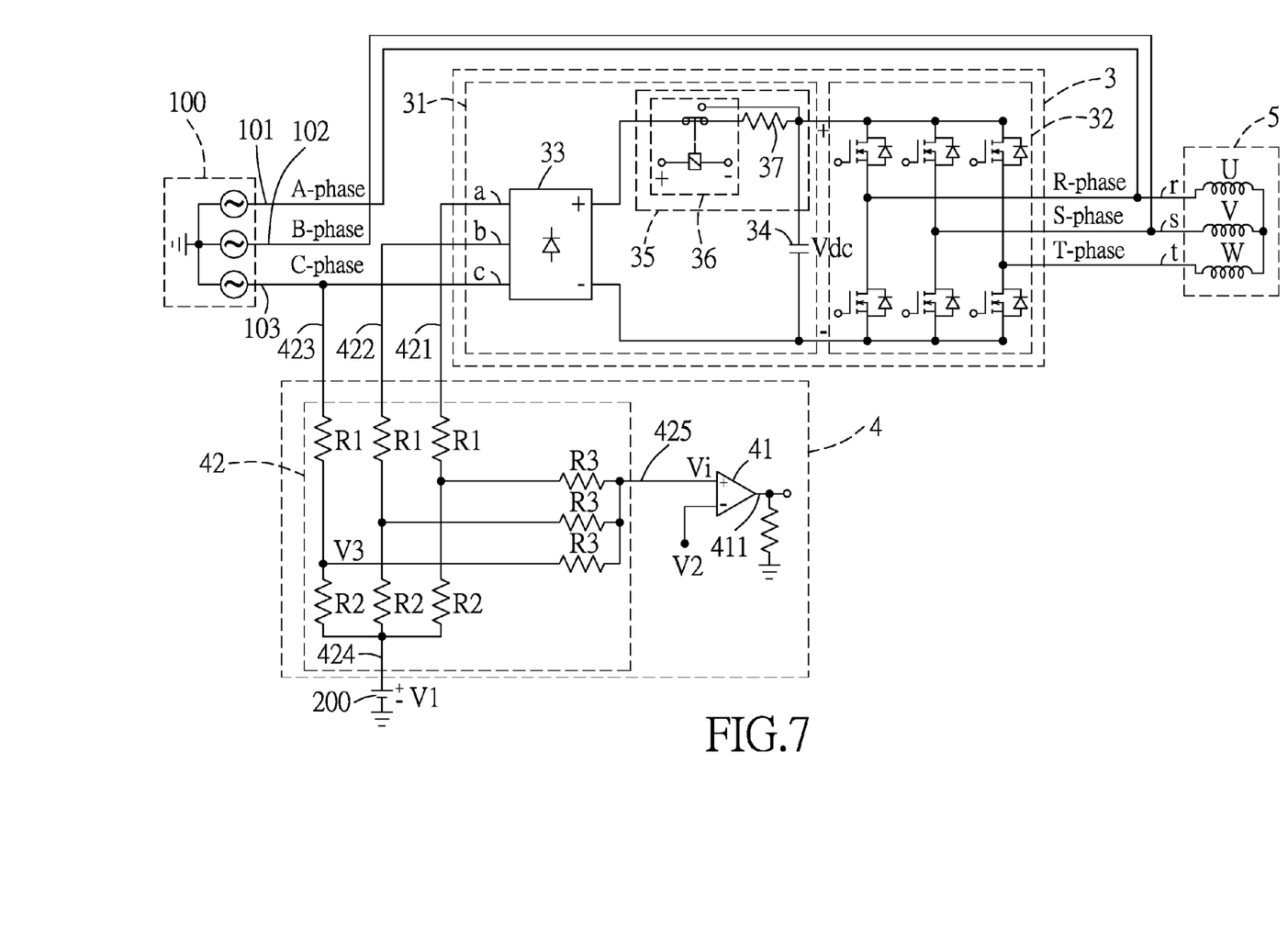
FIG. 7 is a schematic electrical circuit diagram illustrating the embodiment when a misconnection occurs between each of the A-phase terminal and a B-phase terminal of the three-phase AC power source and the three-phase AC-to-AC power converter.
Figure 8:
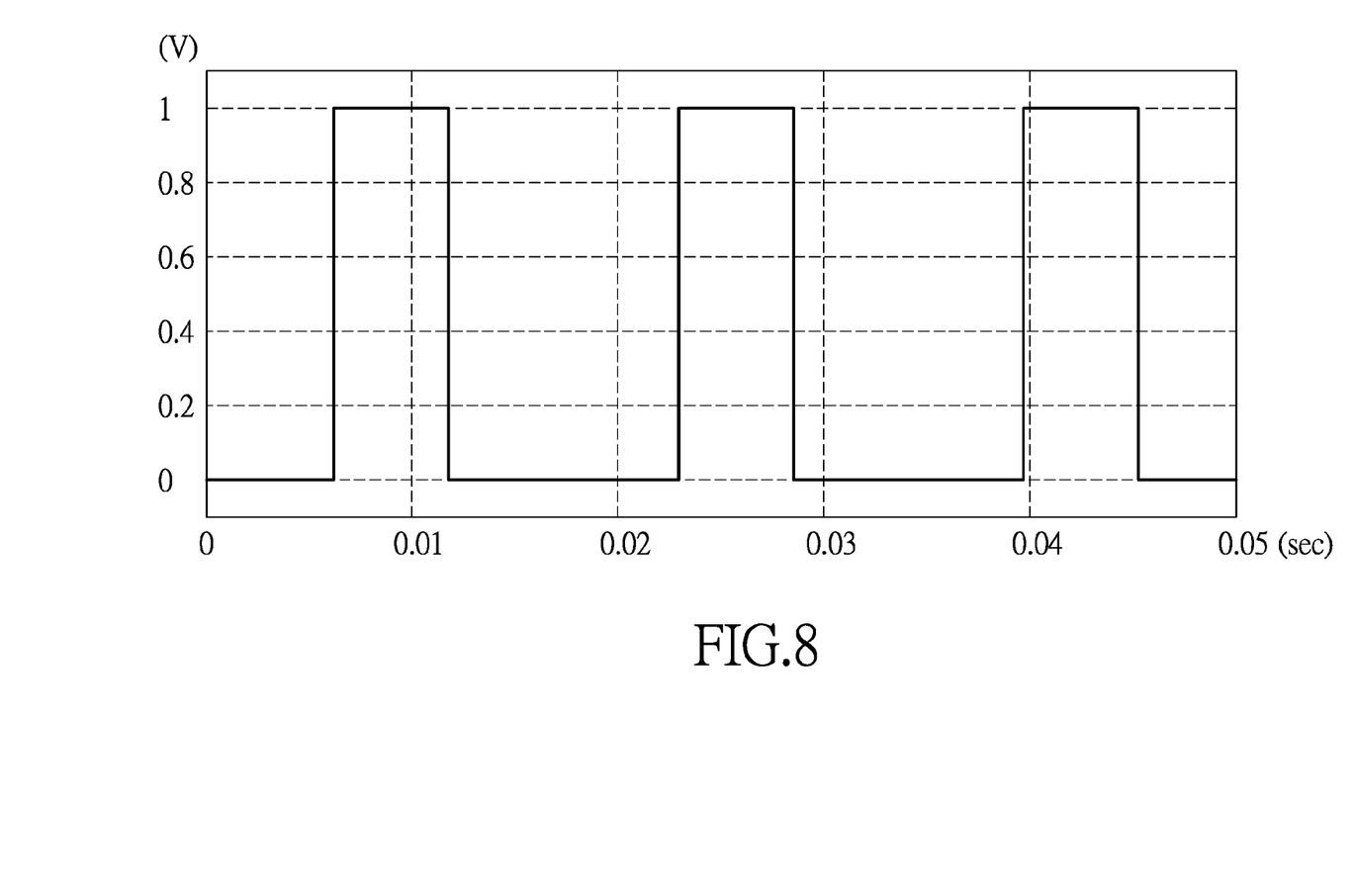
FIG. 8 is a plot exemplarily illustrating the detection signal of the embodiment having a duty cycle of ⅓ under the condition depicted in FIG. 8.

Referring further to FIGS. 7 and 8, for example, when the A- and B-phase terminals 101, 102 of the three-phase AC input power source 100 are unintentionally not connected to the input ends (a, b) of the three-phase AC-to-AC power converter 3 and is misconnected respectively to the output ends (r, s) of the same (in an abnormal condition), only the C-phase AC input power signal is received by the three-phase AC-to-AC power converter 3, such that a phase loss occurs in the three-phase AC-to-AC power converter 3. At the same time, since only the C-phase AC input power signal is received by the detection circuit 4, in each cycle period, the divided voltage (Vi) is maintained at the sum of the predetermined first reference voltage (V1) and the voltage drop (V3) greater than the predetermined second reference voltage (V2) during the active period of the C-phase AC input power signal, and is equal to the predetermined first reference voltage (V1) less than the predetermined second reference voltage (V2) during the remainder of each cycle period. Accordingly, the detection signal outputted by the comparator 41 is maintained at the relatively high voltage level during the active period of the C-phase AC input power signal and at the relatively low voltage level when otherwise. In this case, according to the above example, the detection signal outputted by the comparator 41, as illustrated in FIG. 8, has a duty cycle of ⅓ indicating that two of the A-, B- and C-phase terminals of the three-phase AC power source 100 are misconnected. Further, it can be determined that a phase loss of the three-phase AC power source 100 may occur according to the detection signal.

Figure 9:
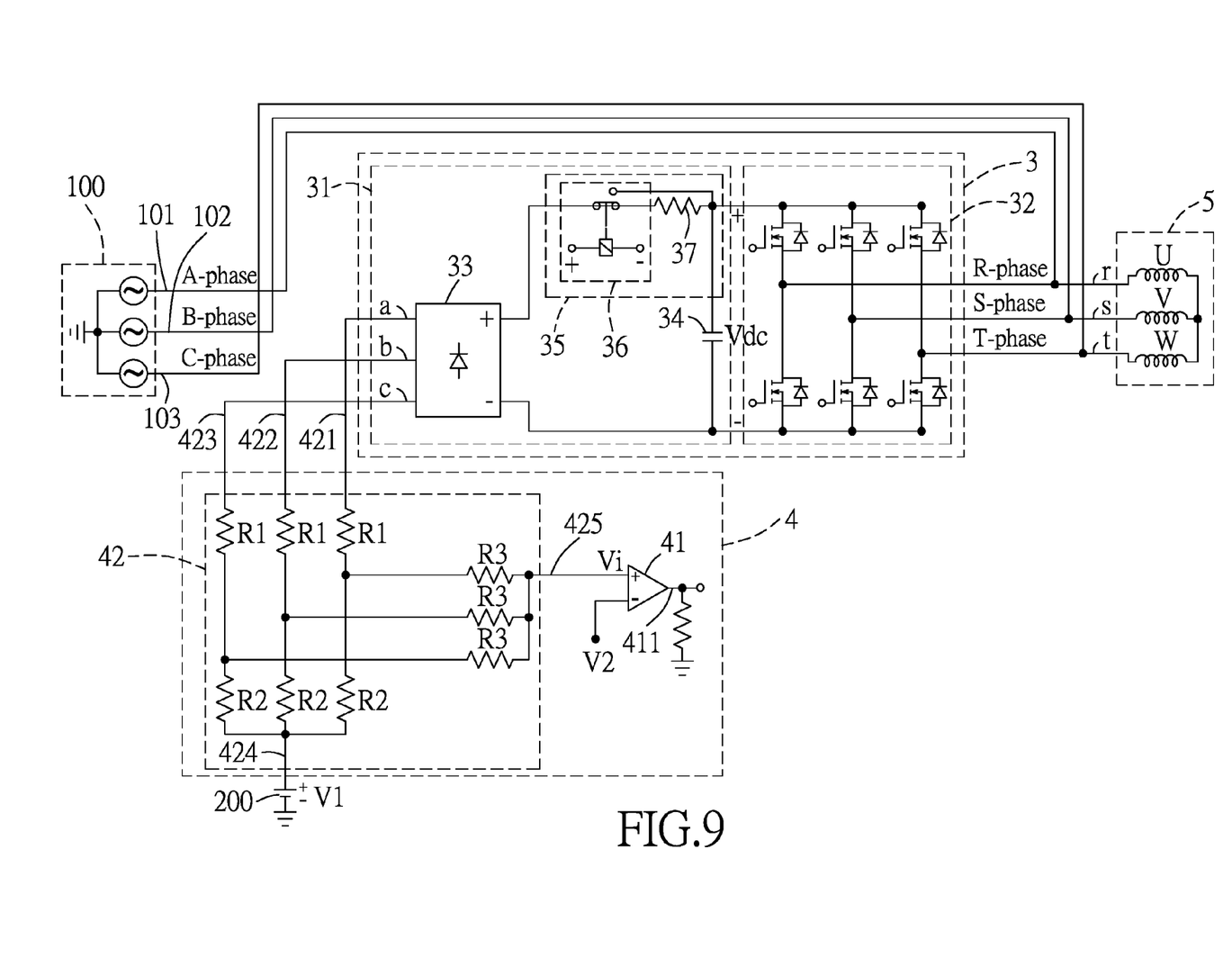
FIG. 9 is a schematic electrical circuit diagram illustrating the embodiment when a misconnection occurs between each of the A- and B-phase terminals and a C-phase terminal of the three-phase AC power source and the three-phase AC-to-AC power converter.
Figure 10:
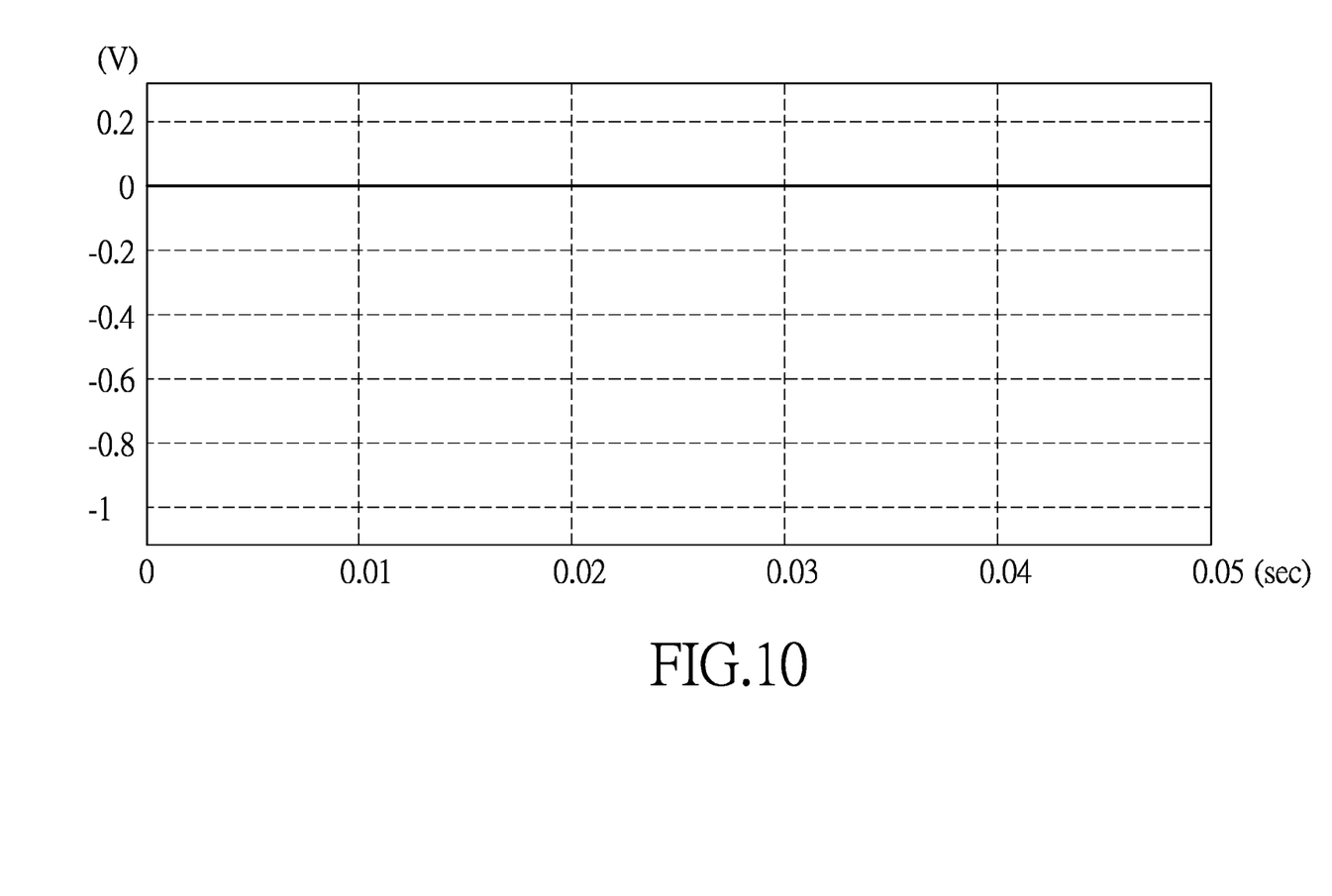
FIG. 10 is a plot exemplarily illustrating the detection signal of the embodiment having a duty cycle of 0 under the condition depicted in FIG. 9.

Referring further to FIGS. 9 and 10, for example, when all the A-, B- and C-phase terminals 101, 102, 103 of the three-phase AC power source 100 are unintentionally not connected to the input ends (a, b, c) of the three-phase AC-to-AC power converter 3 and is misconnected respectively to the output ends (r, s, t) of the same (in an abnormal condition), none of the A-, B- and C-phase AC input power signals is received by the three-phase AC-to-AC power converter 3, such that a serious phase loss occurs in the three-phase AC-to-AC power converter 3. At the same time, since none of the A-, B- and C-phase AC input power signals is received by the voltage divider circuit 42, the divided voltage (Vi) is maintained at the predetermined first reference voltage (V1) less than the predetermined second reference voltage (V2), such that the detection signal outputted by the comparator 41 has a duty cycle of zero. In this case, according to the above example, the detection signal outputted by the comparator 41, as illustrated in FIG. 10, always has a relatively low voltage level of, for example, 0V.

In sum, when only one of the A-, B- and C-phase AC input power signals is received by the respective one of the AC input terminals 421, 422, 423, the duty cycle of the detection signal is ⅓. When only two of the A-, B- and C-phase AC input power signals are received respectively by the respective two of the AC input terminals 421, 422, 423, the duty cycle of the detection signal is ⅔. When all of the A-, B- and C-phase AC input power signals are received by the AC input terminals 421, 422, 423, respectively, the duty cycle of the detection signal is 1. When none of the A-, B- and C-phase AC input power signals is received by the voltage divider circuit 42 of the detection circuit 4, the voltage divider circuit 42 outputs the predetermined first reference voltage (V1) to serve as the divided voltage, such that the detection signal outputted by the comparator 41 of the detection circuit 4 at the comparator output terminal 411 thereof has a duty cycle of zero.

Therefore, the detection signal outputted by the detection circuit 4 can be used to determine whether a phase loss or erroneous wiring connection occurs. Furthermore, upon determining that the detection signal outputted by the detection circuit 4 has a duty cycle of less than 1, an alarm device may produce an alarm output indicating the abnormal power supply condition. Alternatively, an electronic control device (not shown) may be used to terminate electric power supply from the three-phase AC power source 100, thereby preventing malfunctions of or damage to the three-phase AC-to-AC power converter 3 as attributed to abnormal supply of power.

Figure 11:
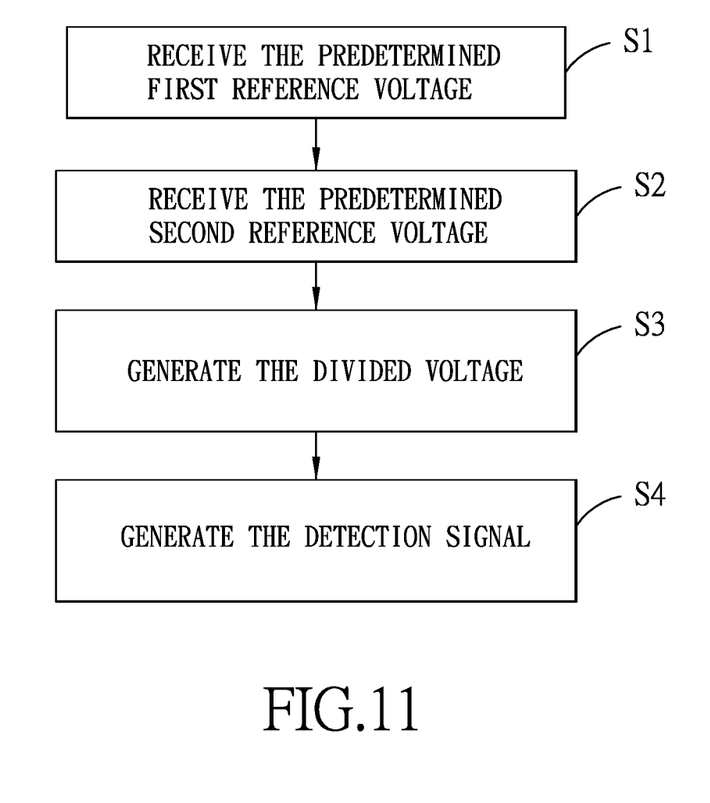
FIG. 11 is a flow chart of a method for automatically detecting the misconnection of the three-phase AC-to-AC power converter to the three-phase AC power source according to an embodiment of this disclosure.

Referring to FIG. 11, a method for automatically detecting the misconnection of the three-phase AC-to-AC power converter 3 to the three-phase AC power source 100 according to an embodiment of this disclosure is implemented by the detection circuit 4.

In step S1, the voltage divider circuit 42 receives the predetermined first reference voltage (V1) from the DC voltage source 200 at the DC input terminal 424 thereof.

In step S2, the comparator 41 receives the predetermined second reference voltage (V2) at the inverting input terminal thereof.

In step S3, when at least one of the A-, B- and C-phase AC input power signals from the three-phase AC power source 100 is received at respective one(s) of the AC input terminals 421, 422, 423 of the voltage divider circuit 42, the voltage divider circuit 42 generates the divided voltage (Vi) at the circuit output terminal 425 based on the predetermined first reference voltage (V1) and said at least one of the A-, B- and C-phase AC input power signals. The divided voltage (Vi) is greater than the predetermined second reference voltage (V2) during the active period of each of said at least one of the A-, B- and C-phase AC input power signals.

In step S4, the comparator 41 generates the detection signal having a duty cycle associated with a combined duty cycle of said at least one of the A-, B- and C-phase AC input power signals.

As described in the above, the detection signal outputted by the detection circuit 4 can be used to determine whether a phase loss or erroneous wiring connection occurs.

It is noted that the detection circuit 4 of this disclosure may be implemented as an independent circuit device that can be detachably coupled with the three-phase AC-to-AC power converter 3.

To sum up, due to the presence of the detection circuit 4, the three-phase AC-to-AC power converting apparatus of this disclosure can automatically detect occurrence of phase loss resulting from erroneous wiring connection.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A detection circuit for a three-phase AC-to-AC power converter, the three-phase AC-to-AC power converter having three input ends that are configured to receive respectively a first-phase AC input power signal, a second-phase AC input power signal and a third-phase AC input power signal from a three-phase AC power source, said detection circuit comprising:
   a voltage divider circuit for generating a divided voltage, and having three AC input terminals that are used to be coupled respectively to the input ends of the three-phase AC-to-AC power converter, a DC input terminal that is used to receive a predetermined first reference voltage from a DC voltage source, and a circuit output terminal at which the divided voltage is generated; and
   a comparator for generating a detection signal, and having a non-inverting input terminal that is coupled to said circuit output terminal of said voltage divider circuit, an inverting input terminal that is used to receive a predetermined second reference voltage, and a comparator output terminal at which the detection signal is generated;
   wherein, when at least one of the first-, second- and third-phase AC input power signals from the three-phase AC power source is received at respective one(s) of said AC input terminals of said voltage divider circuit, said voltage divider circuit generates the divided voltage at said circuit output terminal thereof based on the predetermined first reference voltage and said at least one of the first-, second- and third-phase AC input power signals, the divided voltage being greater than the predetermined second reference voltage during an active period of each of said at least one of the first-, second- and third-phase AC input power signals, such that the detection signal outputted by said comparator has a duty cycle associated with a combined duty cycle of said at least one of the first-, second- and third-phase AC input power signals.

2. The detection circuit as claimed in claim 1, wherein:
   the predetermined second reference voltage is greater than the predetermined first reference voltage; and
   said voltage divider circuit includes
      three resistor units, each of which includes a first resistor that is coupled to a respective one of said AC input terminals of said voltage divider circuit, and a second resistor that is coupled between said first resistor and said DC input terminal of said voltage divider circuit and that has a resistance less than that of said first resistor, a common node between said first and second resistors of each of said resistor units being coupled to said circuit output terminal of said voltage divider circuit.

3. The detection circuit as claimed in claim 2, wherein:
   when one of the first-, second- and third-phase AC input power signals received at the respective one of said AC input terminals of said voltage divider circuit is in an active state, the divided voltage is equal to a sum of the predetermined first reference voltage and a voltage drop across said second resistor of a corresponding one of said resistor units, and is greater than the predetermined second reference voltage during an active period of said one of the first-, second- and third-phase AC input power signals, during which said one of the first-, second- and third-phase AC input power signals is in the active state; and
   when one of the first-, second- and third-phase AC input power signals is not received at the respective one of said AC input terminals of said voltage divider circuit, the divided voltage is equal to the predetermined first reference voltage during a period that corresponds to the active period of the one of the first-, second- and third-phase AC input power signals, and is less than the predetermined second reference voltage.

4. The detection circuit as claimed in claim 3, wherein:
   when only one of the first-, second- and third-phase AC input power signals is received by the respective one of said AC input terminals of said voltage divider circuit, the duty cycle of the detection signal is ⅓;
   when only two of the first-, second- and third-phase AC input power signals are received respectively by the respective two of said AC input terminals of said voltage divider circuit, the duty cycle of the detection signal is ⅔;
   when all of the first-, second- and third-phase AC input power signals are received by said AC input terminals of said voltage divider circuit, respectively, the duty cycle of the detection signal is 1; and
   when none of the first-, second- and third-phase AC input power signals is received by said voltage divider circuit, said voltage divider circuit outputs the predetermined first reference voltage to serve as the divided voltage, such that the detection signal outputted by said comparator at said comparator output terminal thereof has a duty cycle of zero.

5. The detection circuit as claimed in claim 2, wherein each of said resistor units of said voltage divider circuit further includes a third resistor that is coupled between said circuit output terminal of said voltage divider circuit and said common node between said first and second resistors.

6. The detection circuit as claimed in claim 5, wherein a resistance value of said first resistor is greater than a resistance value of said second resistor, and the resistance value of said second resistor is greater than a resistance value of said third resistor.

7. A three-phase AC-to-AC power converting apparatus comprising:
   a three-phase AC-to-AC power converter having three input ends that are configured to receive respectively a first-phase AC input power signal, a second-phase AC input power signal and a third-phase AC input power signal from a three-phase AC power source, and three output ends, said three-phase AC-to-AC power converter being operable, in response to receipt of the first-, second- and third-phase AC input power signals, to convert the first-, second- and third-phase AC input power signals into a first-phase AC output power signal, a second-phase AC output power signal and a third-phase AC output power signal, and to output the first-, second- and third-phase AC output power signals respectively at said output ends; and
   a detection circuit including
      a voltage divider circuit for generating a divided voltage, and having three AC input terminals that are coupled respectively to said input ends of said AC-to-AC power converter, a DC input terminal that is used to receive a predetermined first reference voltage from a DC voltage source, and a circuit output terminal at which the divided voltage is generated, and a comparator for generating a detection signal, and having a non-inverting input terminal that is coupled to said circuit output terminal of said voltage divider circuit, an inverting input terminal that is used to receive a predetermined second reference voltage, and a comparator output terminal at which the detection signal is generated;

wherein, when at least one of the first-, second- and third-phase AC input power signals from the three-phase AC power source is received at respective one(s) of said AC input terminals of said voltage divider circuit, said voltage divider circuit of said detection circuit generates the divided voltage at said circuit output terminal thereof based on the predetermined first reference voltage and said one of the first-, second- and third-phase AC input power signals, the divided voltage being greater than the predetermined second reference voltage during an active period of each of said at least one of the first-, second- and third-phase AC input power signals, such that the detection signal outputted by said comparator of said detection circuit has a duty cycle associated with a combined duty cycle of said at least one of the first-, second- and third-phase AC input power signals.

8. The three-phase AC-to-AC power converting apparatus as claimed in claim 7, wherein said three-phase AC-to-AC power converter includes:

a rectifying and filtering circuit having said input ends, and rectifying and filtering the first-, second- and third-phase AC input power signals to generate a DC voltage signal; and an electronic inverter coupled to said rectifying and filtering circuit for receiving the DC voltage signal therefrom and having said output ends, said electronic inverter being operable to generate, based on the DC voltage signal, the first-, second- and third-phase AC output power signals, and outputting the first-, second- and third-phase AC output power signals respectively at said output ends.

9. The three-phase AC-to-AC power converting apparatus as claimed in claim 8, wherein:

the predetermined second reference voltage is greater than the predetermined first reference voltage; and said voltage divider circuit of said detection circuit includes three resistor units, each of which includes a first resistor that is coupled to a respective one of said AC input terminals of said voltage divider circuit, and a second resistor that is coupled between said first resistor and said DC input terminal of said voltage divider circuit and that has a resistance less than that of said first resistor, a common node between said first and second resistors of each of said resistor units being coupled to said circuit output terminal of said voltage divider circuit.

10. The three-phase AC-to-AC power converting apparatus as claimed in claim 9, wherein:

when one of the first-, second- and third-phase AC input power signals received at the respective one of said AC input terminals of said voltage divider circuit of said detection circuit is in an active state, the divided voltage is equal to a sum of the predetermined first reference voltage and a voltage drop across said second resistor of a corresponding one of said resistor units, and is greater than the predetermined second reference voltage during an active period of said one of the first-, second- and third-phase AC input power signals, during which said one of the first-, second- and third-phase AC input power signals is in the active state; and when one of the first-, second- and third-phase AC input power signals is not received at the respective one of said AC input terminals of said voltage divider circuit of said detection circuit, the divided voltage is equal to the predetermined first reference voltage during a period that corresponds to the active period of the one of the first-, second- and third-phase AC input power signals, and is less than the predetermined second reference voltage.

11. The three-phase AC-to-AC power converting apparatus as claimed in claim 10, wherein:

when only one of the first-, second- and third-phase AC input power signals is received by the respective one of said AC input terminals of said voltage divider circuit of said detection circuit, the duty cycle of the detection signal is $\frac{1}{3}$;

when only two of the first-, second- and third-phase AC input power signals are received respectively by the respective two of said AC input terminals of said voltage divider circuit of said detection circuit, the duty cycle of the detection signal is $\frac{2}{3}$;

when all of the first-, second- and third-phase AC input power signals are received by said AC input terminals of said voltage divider circuit, respectively, the duty cycle of the detection signal is 1; and when none of the first-, second- and third-phase AC input power signals is received by said voltage divider circuit of said detection circuit, said voltage divider circuit of said detection circuit outputs the predetermined first reference voltage to serve as the divided voltage, such that the detection signal outputted by said comparator of said detection circuit at said comparator output terminal thereof has a duty cycle of zero.

12. The three-phase AC-to-AC power converting apparatus as claimed in claim 9, wherein each of said resistor units of said voltage divider circuit of said detection circuit further includes a third resistor that is coupled between said common node between said first and second resistors, and said circuit output terminal of said voltage divider circuit.

13. The three-phase AC-to-AC power converting apparatus as claimed in claim 12, wherein a resistance value of said first resistor is greater than a resistance value of said second resistor, and the resistance value of said second resistor is greater than a resistance value of said third resistor.

14. The three-phase AC-to-AC power converting apparatus as claimed in claim 7, wherein:

the predetermined second reference voltage is greater than the predetermined first reference voltage; and said voltage divider circuit of said detection circuit includes three resistor units, each of which includes a first resistor that is coupled to a respective one of said AC input terminals of said voltage divider circuit, and a second resistor that is coupled between said first resistor and said DC input terminal of said voltage divider circuit and that has a resistance less than that of said first resistor, a common node between said first and second resistors of each of said resistor units being coupled to said circuit output terminal of said voltage divider circuit.

15. The three-phase AC-to-AC power converting apparatus as claimed in claim 14, wherein:

when one of the first-, second- and third-phase AC input power signals received at the respective one of said AC input terminals of said voltage divider circuit of said detection circuit is in an active state, the divided voltage is equal to a sum of the predetermined first reference voltage and a voltage drop across said second resistor of a corresponding one of said resistor units, and is greater than the predetermined second reference voltage during an active period of said one of the first-, second- and third-phase AC input power signals, during which said one of the first-, second- and third-phase AC input power signals is in the active state; and when one of the first-, second- and third-phase AC input power signals is not received at the respective one of said AC input terminals of said voltage divider circuit of said detection circuit, the divided voltage is equal to the predetermined first reference voltage during a period that corresponds to the active period of the one of the first-, second- and third-phase AC input power signals, and is less than the predetermined second reference voltage.

16. The three-phase AC-to-AC power converting apparatus as claimed in claim 15, wherein:

when only one of the first-, second- and third-phase AC input power signals is received by the respective one of said AC input terminals of said voltage divider circuit of said detection circuit, the duty cycle of the detection signal is ⅓;

when only two of the first-, second- and third-phase AC input power signals are received respectively by the respective two of said AC input terminals of said voltage divider circuit of said detection circuit, the duty cycle of the detection signal is ⅔;

when all of the first-, second- and third-phase AC input power signals are received by said AC input terminals of said voltage divider circuit, respectively, the duty cycle of the detection signal is 1; and when none of the first-, second- and third-phase AC input power signals is received by said voltage divider circuit of said detection circuit, said voltage divider circuit of said detection circuit outputs the predetermined first reference voltage to serve as the divided voltage, such that the detection signal outputted by said comparator of said detection circuit at said comparator output terminal thereof has a duty cycle of zero.

17. The three-phase AC-to-AC power converting apparatus as claimed in claim 14, wherein each of said resistor units of said voltage divider circuit of said detection circuit further includes a third resistor that is coupled between said common node between said first and second resistors, and said circuit output terminal of said voltage divider circuit.

18. The three-phase AC-to-AC power converting apparatus as claimed in claim 17, wherein a resistance value of said first resistor is greater than a resistance value of said second resistor, and the resistance value of said second resistor is greater than a resistance value of said third resistor.

19. A method for automatically detecting a misconnection of a three-phase AC-to-AC power converter to a three-phase AC power source, the three-phase AC-to-AC power converter having three input ends that receives respectively a first-phase AC input power signal, a second-phase AC input power signal and a third-phase AC input power signal from the three-phase AC power source, the method to be implemented by the detection circuit of claim 1, the method comprising the steps of:

receiving, at the DC input terminal of the voltage divider circuit, the predetermined first reference voltage from the DC voltage source;

receiving, at the inverting input terminal of the comparator, the predetermined second reference voltage;

when at least one of the first-, second- and third-phase AC input power signals from the three-phase AC power source is received at respective one (s) of the AC input terminals of the voltage divider circuit, generating, by the voltage divider circuit, the divided voltage at the circuit output terminal based on the predetermined first reference voltage and said at least one of the first-, second- and third-phase AC input power signals, the divided voltage being greater than the predetermined second reference voltage during the active period of each of said at least one of the first-, second- and third-phase AC input power signals; and generating, by the comparator, the detection signal having the duty cycle associated with the combined duty cycle of said at least one of the first-, second- and third-phase AC input power signals.

20. The method as claimed in claim 19, wherein:

when only one of the first-, second- and third-phase AC input power signals is received by the respective one of said AC input terminals of said voltage divider circuit of said detection circuit, the duty cycle of the detection signal is ⅓;

when only two of the first-, second- and third-phase AC input power signals are received respectively by the respective two of said AC input terminals of said voltage divider circuit of said detection circuit, the duty cycle of the detection signal is ⅔;

when all of the first-, second- and third-phase AC input power signals are received by said AC input terminals of said voltage divider circuit, respectively, the duty cycle of the detection signal is 1; and when none of the first-, second- and third-phase AC input power signals is received by said voltage divider circuit of said detection circuit, said voltage divider circuit of said detection circuit outputs the predetermined first reference voltage to serve as the divided voltage, such that the detection signal outputted by said comparator of said detection circuit at said comparator output terminal thereof has a duty cycle of zero.

* * * * *